(12) United States Patent
Spann

(10) Patent No.: US 10,243,314 B2
(45) Date of Patent: Mar. 26, 2019

(54) SEMICONDUCTOR LAYER VARIATION FOR SUBSTRATE REMOVAL AFTER BONDING

(71) Applicant: Skorpios Technologies, Inc., Albuquerque, NM (US)

(72) Inventor: John Y. Spann, Albuquerque, NM (US)

(73) Assignee: Skorpios Technologies, Inc., Albuquerque, NM (US)

(*) Notice: Subject to any disclaimer, the term of this patent is extended or adjusted under 35 U.S.C. 154(b) by 0 days.

(21) Appl. No.: 15/268,951

(22) Filed: Sep. 19, 2016

(65) Prior Publication Data
US 2017/0085056 A1    Mar. 23, 2017

Related U.S. Application Data

(60) Provisional application No. 62/220,390, filed on Sep. 18, 2015.

(51) Int. Cl.
*H01S 3/063*  (2006.01)
*H01S 5/022*  (2006.01)
(Continued)

(52) U.S. Cl.
CPC ............ *H01S 3/0637* (2013.01); *G02B 6/12* (2013.01); *H01S 5/0206* (2013.01); *H01S 5/026* (2013.01); *H01S 5/0217* (2013.01); *H01S 5/0228* (2013.01); *G02B 2006/12121* (2013.01); *H01S 5/021* (2013.01); *H01S 5/3434* (2013.01); *H01S 2301/173* (2013.01)

(58) Field of Classification Search
CPC ...... H01S 3/0637; H01S 5/0206; H01S 5/026; H01S 5/0217; H01S 5/0228; H01S 5/02272; H01S 5/021; H01S 5/3434; G02B 6/12; G02B 2006/12121
See application file for complete search history.

(56) References Cited

U.S. PATENT DOCUMENTS 5,793,060 A * 8/1998 Morikawa ............... B82Y 20/00
                                                257/21
5,835,521 A * 11/1998 Ramdani ............... H01S 5/1838
                                                372/50.124
(Continued)

FOREIGN PATENT DOCUMENTS

JP        2005-209952 A    8/2005

OTHER PUBLICATIONS

International Search Report and Written Opinion dated Dec. 19, 2016 for International Patent Application No. PCT/US2016/052453, filed Sep. 19, 2016; all pages.

*Primary Examiner* — Yuanda Zhang
(74) *Attorney, Agent, or Firm* — Kilpatrick Townsend & Stockton LLP

(57) ABSTRACT

A device for a gain medium for a semiconductor laser has an active region, a buffer layer, a substrate, and an etch stop between the buffer layer and the substrate. The device is bonded to a silicon platform having silicon devices, such as a waveguide and mirror. The substrate is removed, after bonding the device to the platform. The buffer layer is made of different material than the substrate to reduce undercut of the buffer layer during substrate removal compared to a buffer layer made of the same material as the substrate.

19 Claims, 5 Drawing Sheets

(51) Int. Cl.
*G02B 6/12* (2006.01)
*H01S 5/026* (2006.01)
*H01S 5/02* (2006.01)
*H01S 5/343* (2006.01)

(56) References Cited

U.S. PATENT DOCUMENTS

| | | | |
|---|---|---|---|
| 6,323,052 B1 * | 11/2001 | Horie | B82Y 20/00 |
| | | | 257/E33.054 |
| 6,567,448 B1 * | 5/2003 | Sun | H01S 5/18308 |
| | | | 372/50.1 |
| 6,574,021 B1 | 6/2003 | Green et al. | |
| 7,567,601 B1 | 7/2009 | Sudo et al. | |
| 8,859,394 B2 | 10/2014 | Dallesasse et al. | |
| 9,097,846 B2 | 8/2015 | Mizrahi et al. | |
| 2002/0080836 A1 | 6/2002 | Hwang | |
| 2004/0013154 A1 | 1/2004 | Zheng | |
| 2006/0180830 A1 * | 8/2006 | Alavi | B82Y 20/00 |
| | | | 257/184 |
| 2012/0057816 A1 * | 3/2012 | Krasulick | G02B 6/12 |
| | | | 385/14 |
| 2015/0098676 A1 | 4/2015 | Krasulick et al. | |

* cited by examiner

SEMICONDUCTOR LAYER VARIATION FOR SUBSTRATE REMOVAL AFTER BONDING

CROSS-REFERENCE TO RELATED APPLICATION

This application claims priority to U.S. Provisional Patent Application No. 62/220,390, filed on Sep. 18, 2015, entitled "Semiconductor Layer Variation For Substrate Removal After Bonding," the disclosure of which is hereby incorporated by reference in its entirety for all purposes.

BACKGROUND OF THE INVENTION

Integrated circuits ("ICs") using silicon have dominated the development of electronics. Many technologies based upon silicon processing have been developed over the years. Their continued refinement led to nano-scale feature sizes that can be important for making complementary metal-oxide-semiconductor (CMOS) circuits. Though many processes have been developed for processing silicon, silicon has an indirect bandgap, making silicon a poor optical emitter. Thus silicon has been combined with other semiconductor materials to make photonic ICs. Examples of other materials combined with silicon include III-V materials, such as gallium arsenide (GaAs). There is a need in the art for improved methods and systems related to photonic ICs using silicon to form photonic ICs.

BRIEF SUMMARY OF THE INVENTION

Embodiments of the present invention generally relate to forming a composite device to combine functionality of silicon with a different semiconductor material to create a photonic device. A III-V chip is bonded to a silicon platform to provide additional capabilities for a composite device (e.g., the III-V chip is used as an optical gain medium or a modulator). A substrate of the chip is removed after bonding using a substrate-removal etch. In some embodiments, the substrate is removed so electrical contacts can be formed on the chip to apply voltage and/or current to an active region of the chip.

However, undercut is seen on chips after the substrate-removal etch. The undercut is formed because the substrate-removal etch also removes like-kind material of the chip (e.g., material of the chip that is the same as material of the substrate of the chip). Protection of other layers of the chip has been difficult. In some embodiments, like-kind material is changed to a material that is more etch resistant to reduce etching of other layers of the chip.

In some embodiments, a device for a gain medium of a semiconductor laser comprises an active region, a buffer layer, a substrate, and an etch stop. The active region comprises alternating layers of a first material and a second material. The alternating layers of the first material and the second material form a multi-quantum well. The first material is used as wells of the multi-quantum well. The second material is used as barrier layers of the multi-quantum well. The buffer layer is made of a third material. The substrate is made of a fourth material. The fourth material is different from the third material. The etch stop is made of a fifth material. The buffer layer is between the multi-quantum well and the etch stop. The etch stop is between the buffer layer and the substrate, to facilitate substrate removal. The fifth material is different from the third material and the fourth material. In some embodiments, the third material is a ternary semiconductor or a quaternary semiconductor (e.g., InGaAsP) and the fourth material is a binary semiconductor (e.g., InP). In some embodiments, the device further comprises cladding layers for forming a separate confinement heterostructure. In some embodiments, the device is a first device and is bonded in a recess of a second device (e.g., a platform comprising silicon).

In some embodiments, a method for creating a composite device for use as a semiconductor laser comprises providing the first device as a gain medium for the semiconductor laser; providing the second device, as a platform; bonding the first device to a floor of a recess of the second device so that the active region of the first device is optically aligned with a device layer of the second device; and etching the first device, after bonding the first device to the second device, to remove at least a portion of the substrate of the first device. Undercut of the buffer layer of the first device is reduced because the third material is different from the fourth material. In some embodiments, etching the substrate includes a deep etch (e.g., removing more than 200 µm of substrate).

In some embodiments, a composite semiconductor device comprises the first device bonded to the second device. In some embodiments, the first device comprises III-V material and the second device comprises silicon.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments generally relate to a gain medium of a semiconductor laser having a buffer layer of different material than a substrate. The buffer layer is of different material than the substrate so that during substrate removal, the buffer layer is not undercut by etchant leaking around an etch stop.

Figure 1:
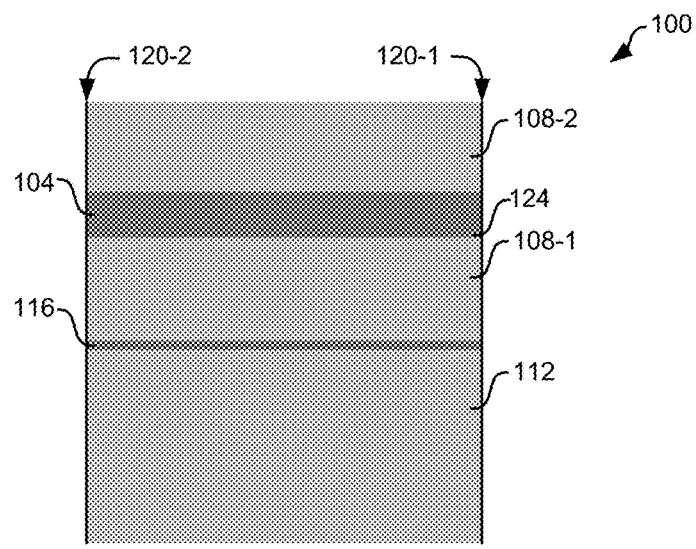
FIG. 1 depicts a simplified diagram of an embodiment of a first device for a gain medium of a semiconductor laser.

Referring first to FIG. 1, a simplified diagram of an embodiment of a first device 100 for a gain medium of a semiconductor laser is shown. The first device 100 comprises an active region 104, a first buffer layer 108-1, a second buffer layer 108-2, a substrate 112, and an etch stop 116 between the substrate 112 and the first buffer layer 108-1. The first device 100 is sometimes referred to as a chip and/or a chiplet.

The active region 104 emits light. The active region 104 comprises alternating layers of a first material and a second material forming a multi-quantum well. The first material has a smaller bandgap than the second material. In some embodiments, a layer of the second material has a thickness small enough for an electron to tunnel, quantum mechanically, through the layer of the second material. In some embodiments, a layer of the second material has a thickness large enough to prevent tunneling. In some embodiments, the multi-quantum well has a thickness (measured vertically) from 5 nm to 3 μm, or from 10 nm to 500 nm.

The active region 104 emits light toward a first side 120-1 and toward a second side 120-2 of the first device 100 (arrows of the 120-1 and 120-2 lead lines each indicate a surface shown by a line looking along a direction of the arrow). Horizontal is defined as parallel to an interface 124 between the active region 104 and the first buffer layer 108-1. Light is emitted horizontally out of the first device 100, through the first side 120-1 and/or the second side 120-2 (e.g., as opposed to vertical emission as is done with a vertical cavity surface emitting laser).

The first buffer layer 108-1 is made of a third material. The third material comprises semiconductor material. In some embodiments, the third material has a larger bandgap and/or lower index of refraction than the first material and the second material. The substrate 112 is made of a fourth material. The etch stop 116 is made of a fifth material. The fifth material is different from the third material and the fourth material. In some embodiments, the etch stop 116 comprises InGaAsP (e.g., with $As_{0.62}P_{0.38}$).

Figure 2:
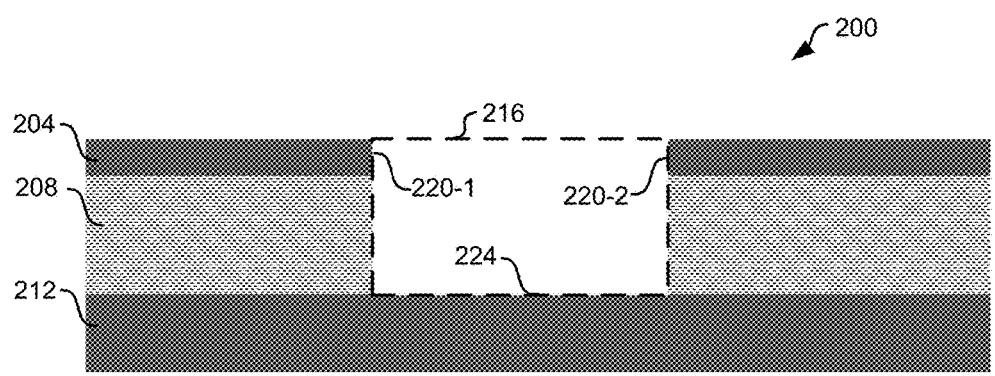
FIG. 2 depicts a simplified drawing of an embodiment of a portion of a second device.

Referring next to FIG. 2, a simplified drawing of an embodiment of a portion of a second device 200 is shown. The second device 200 comprises a device layer 204, an insulating layer 208, and a support layer 212. The insulating layer 208 is between the device layer 204 and the support layer 212. In some embodiments, the device layer 204, the insulating layer 208, and the support layer 212 are part of a silicon-on-insulator (SOI) wafer (e.g., the insulating layer 208 is a buried-oxide (BOX) layer, and the support layer 212 is a handle of the SOI wafer). In some embodiments, the device layer 204 and/or the support layer 212 are made of crystalline silicon, and/or the insulating layer 208 is made of silica (SiO2). The second device 200 is sometimes referred to as a platform.

A recess 216 is formed in the second device 200 (e.g., by etching). The recess 216 is defined by a first wall 220-1 and a second wall 220-2 in the device layer 204 and a floor 224 defined in the support layer 212. In some embodiments, the walls 220 include the insulating layer 208 and/or a part of the support layer 212. The floor 224 is a horizontal surface part of the support layer 212, wherein horizontal is parallel to an interface between the insulating layer 208 and the support layer 212.

Figure 3:
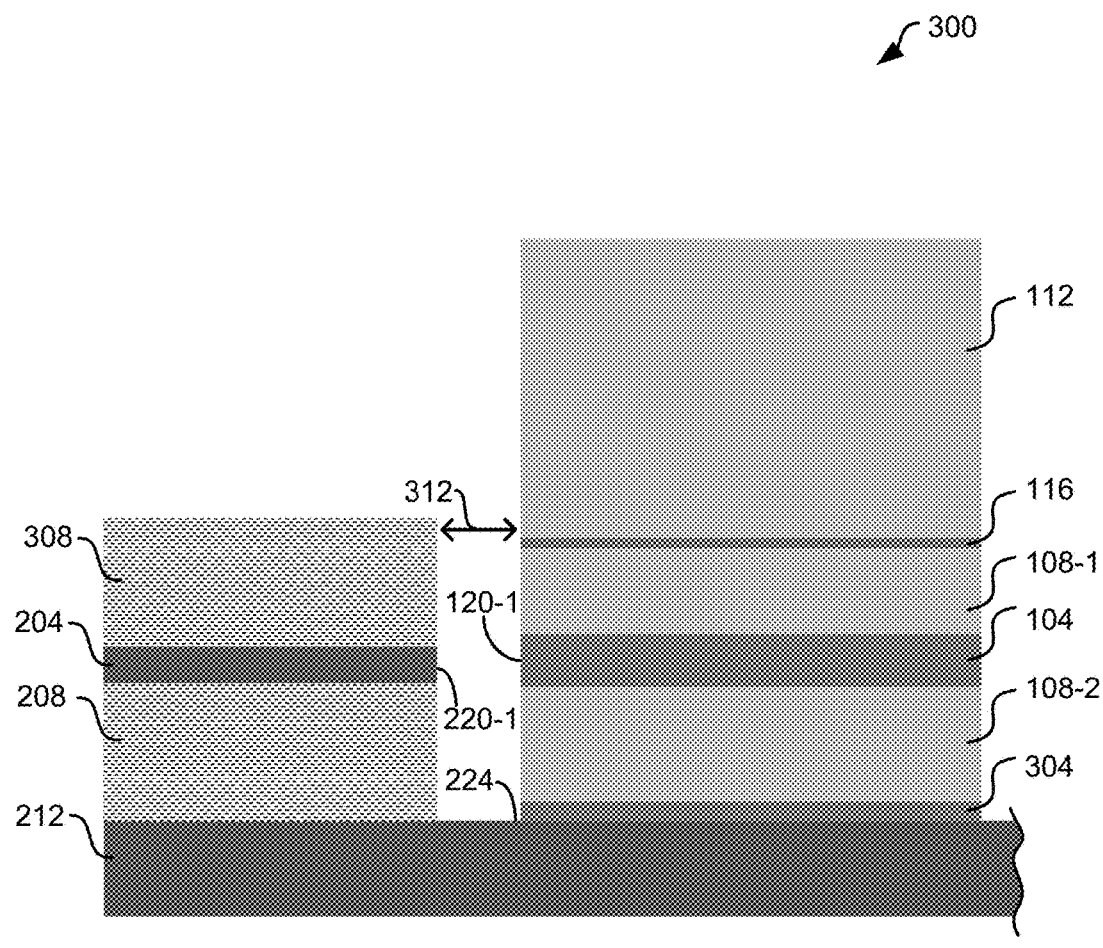
FIG. 3 depicts a simplified diagram of a portion of an embodiment of a composite device.

FIG. 3, depicts a simplified diagram of a portion of an embodiment of a composite device 300. In some embodiments, the composite device 300 is used as a semiconductor laser. The first device 100 is bonded to the second device 200, wherein the first device 100 is a gain medium for the semiconductor laser.

The composite device 300 comprises at least a portion of the first device 100 bonded to the second device 200. To make the composite device 300, bond material 304 (e.g., under-bump metallization layers with a solder) is applied to the second buffer layer 108-2 of the first device 100 and/or to the floor 224 of the second device 200. The first device 100 is then "flipped" and bonded to the floor 224, in the recess 216, of the second device 200 (e.g., the second buffer layer 108-2 is bonded to the floor 224 of the second device 200). The active region 104 of the first device 100 is aligned (e.g., horizontally, optically aligned) with the device layer 204 of the second device 200. For example, the active region 104 is optically aligned with a waveguide, made of crystal-line silicon, in the device layer 204, such that light emitted from the first side 120-1 of the active region 104 is coupled into the waveguide of the device layer 204. The bond material 304 forms a bond between the first device 100 and the second device 200, securing the first device 100 to the second device 200 (e.g., the bond is formed by heating solder used in under-bump metallization). In some embodiments, optical devices such as one or more waveguide, grating, mirror, coupler, detector, multiplexer, and/or de-multiplexer are formed in the device layer 204 of the second device 200.

In some embodiments, the first device 100 is bonded to the second device 200 to form a hybrid semiconductor as discussed in U.S. patent application Ser. No. 14/509,914, filed on Oct. 8, 2014, which is incorporated by reference for all purposes. The '914 application describes systems and methods for bonding a III-V chip to a silicon platform. In some embodiments, the first device 100, a chip, is bonded to the platform, e.g., to the second device 200, using template assisted bonding (e.g., as described in U.S. Pat. No. 8,859, 394, issued Oct. 14, 2014, which is incorporated by reference).

In some embodiments, the substrate 112 of the first device 100 is removed after bonding to make contacts on the first device 100 to apply voltage and/or current to the active region 104. In some embodiments, the second device 200 has a covering 308 used as an upper cladding for a waveguide formed in the device layer 204. In some embodiments, the substrate 112 is removed after bonding so that the first device 100 can be hermetically sealed in the recess 216 of the second device 200 (e.g., the first device 100 covered by SiO2). A gap 312 separates the first side 120-1 of the first device 100 from the first wall 220-1 of the second device 200. In some embodiments, the gap 312 is filled with photoresist before etching in an attempt to protect the first side 120-1 of the first device 100. Applicant discovered that etchant can leak past the etch stop 116 and/or the photoresist to attack the buffer layers 108. In some embodiments, after removing the substrate 112, the gap 312 is filled with material forming a waveguide coupler (e.g., as described in U.S. Pat. No. 9,097,846, granted on Aug. 4, 2015, which is incorporated by reference for all purposes). Thus the first side 120-1 and/or the second side 120-2 of the first device 100 have an index-matching material contacting the first side 120-1 and/or the second side 120-2.

Figure 4:
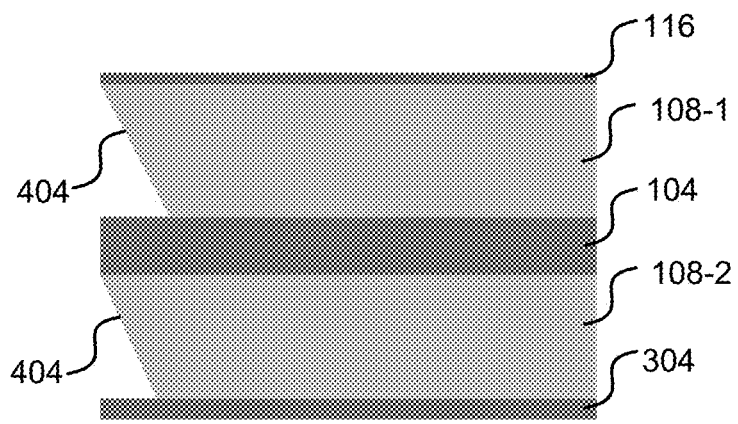
FIG. 4 depicts a simplified drawing of an example of an embodiment of the first device after removing a substrate.

FIG. 4 depicts a simplified drawing of an example of an embodiment of the first device 100 after removing the substrate 112. The embodiment of the first device 100 in FIG. 4 has the third material, of the buffer layer 108, similar to the fourth material, of the substrate 112 (e.g., both InP). In some embodiments, InP is used for the substrate 112 to provide lattice matching for the first material and the second material so that the active region 104 emits a particular wavelength of light (e.g., quantum wells of InAsP and/or AlGaInAs to emit infrared light between 1200 nm and 1600 nm, for optical-fiber communication). In some embodiments, InP is used for the substrate 112 because InP can be removed by etching. In some embodiments, InP is used in the buffer layers 108 because InP as a binary semiconductor (e.g., InP, GaAs, or AlAs) is easier to grow than a ternary semiconductor (e.g., AlGaAs) or a quaternary semiconductor (e.g., InGaAsP). Also, in some embodiments, InP has a lower index of refraction than a ternary semiconductor and/or quaternary semiconductor, allowing for better mode confinement (e.g., of higher-order modes).

However, having buffer layers 108 of the same material as the substrate 112 can cause drawbacks. Besides the substrate 112 being removed, buffer layers 108 are also partially etched forming undercuts 404 in the buffer layers 108. The undercuts 404 are made by etchant used in removing the substrate 112 also attacking the buffer layers 108. In some embodiments, an aggressive etch is used for removing the substrate 112. In some embodiments, an aggressive etch is used to remove a substrate 112 that is thick (e.g., thick being greater than or equal to 150, 200, 225, 250, or 300 µm and less than or equal to 300 µm, 400 µm, 500 µm, 750 µm, 1 mm, 2 mm, or 5 mm). For example, a thickness (measured vertically) of a portion of the substrate 112 that is removed had a thickness between 150 µm and 1 mm before etching. Because of aggressive etching, etch material that leaks past the etch stop 116 can etch the buffer layers 108. In some embodiments, photoresist is applied on to and/or next to the first device 100 to protect the sides 120 of the first device 100. But Applicant has found that by etching the substrate 112 (e.g., a 250 µm wet etch), etching material gets past the photoresist and around the etch stop 116 (perhaps because the photoresist lacks a mechanical strength for such a deep etch and begins to crack and/or separate from sides 120 of the first device 100).

Figure 5:
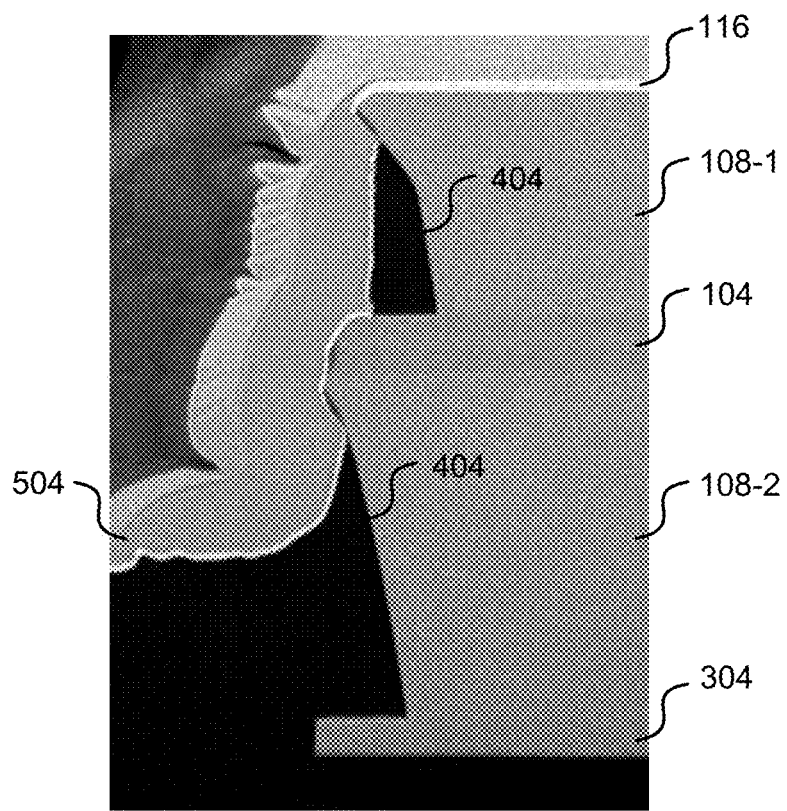
FIG. 5 shows an image of an embodiment of the first device showing undercut of buffer layers.

FIG. 5 shows an image of an embodiment of the first device 100, similar to FIG. 4, showing undercut 404 of buffer layers 108. FIG. 5 shows photoresist 504 applied to an embodiment of the first device 100, wherein the third material is the same as the fourth material. Applicant has found undercut 404 to be undesirable. For example, undercut 404 is undesirable because undercut 404 can cause scattering of light from the active region 104.

Figure 6:
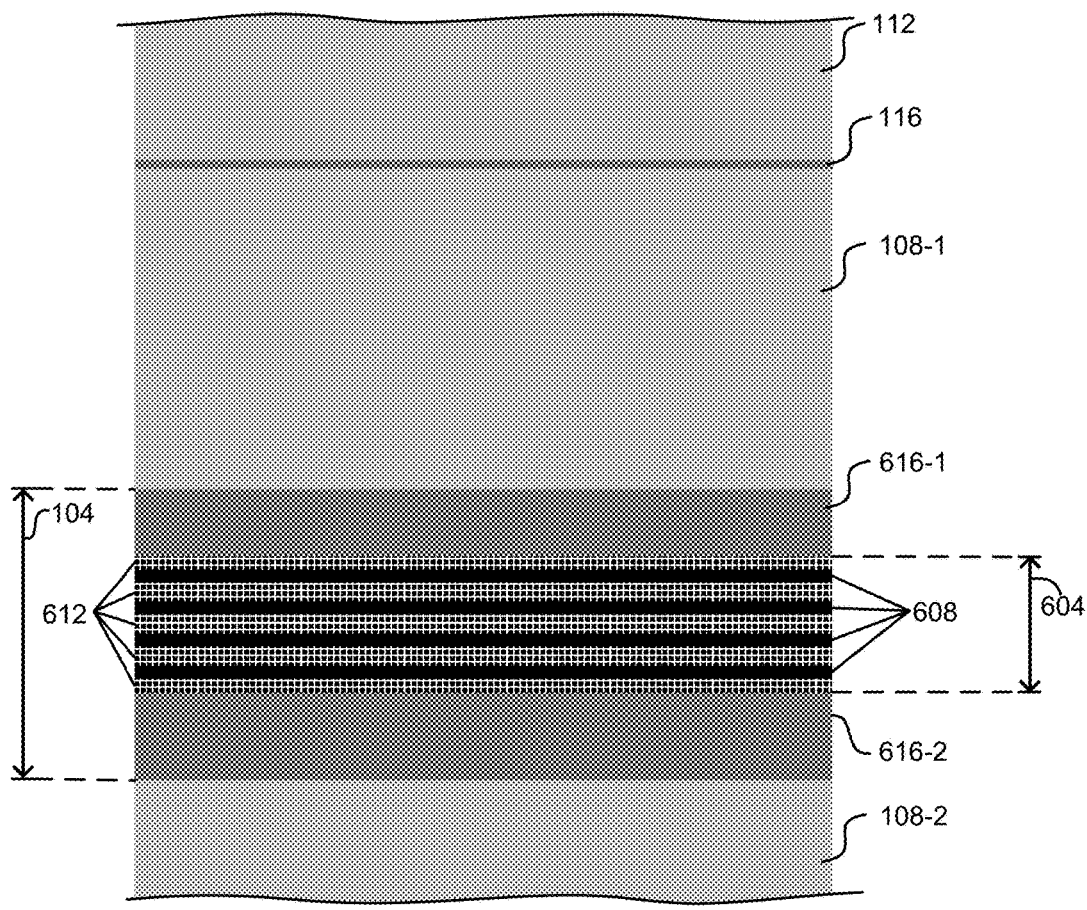
FIG. 6 shows a simplified diagram of an embodiment of the first device, wherein buffer layers are made of a different material than the substrate.

FIG. 6 shows a simplified diagram of an embodiment of the first device 100 wherein buffer layers 108 are made of a different material than the substrate 112. The first device 100 comprises an active region 104 comprising alternating layers of a first material and a second material, a buffer layer 108 (e.g., a first buffer layer 108-1) made of a third material, a substrate 112 made of a fourth material, and an etch stop 116 made of a fifth material.

The active region 104 comprises alternating layers of the first material and the second material forming a multi-quantum well 604, wherein the first material is used as wells 608 and the second material is used as barrier layers 612 of the multi-quantum well 604. Though four wells 608 are shown, more or less wells 608 could be used. For example, in some embodiments, a number of wells 608 is between 10 and 200 and/or 30 and 70 (e.g., 20, 50, 65, or 70).

The fourth material (of the substrate 112) is different from the third material (of the first buffer layer 108-1). The first buffer layer 108-1 is between the multi-quantum well 604 and the etch stop 116. The etch stop 116 is between the first buffer layer 108-1 and the substrate 112 to facilitate removal of the substrate 112. The fifth material is different from the third material and/or the fourth material. In some embodiments, the first buffer layer 108-1 is directly adjacent to the etch stop 116.

In some embodiments, the third material is different from the fourth material in that the third material comprises a ternary semiconductor or a quaternary semiconductor and the fourth material is a binary semiconductor. A binary semiconductor is mixture of two elements (e.g., one element from column III on the periodic table and one element from column V on the periodic table). Examples of elements in column III on the periodic table include Aluminum (Al), Gallium (Ga), and Indium (In). Examples of elements in column V on the periodic table include Phosphorus (P), Arsenic (As), and Antimony (Sb). A ternary semiconductor is a mixture of three elements (e.g., one element from column III on the periodic table and two elements from column V on the periodic table; or two elements from column III on the periodic table and one element from column V on the periodic table). A quaternary semiconductor is a mixture of four elements (e.g., two elements from group III and two elements from group V; three elements from group III and one element from group V; or one element from group III and three elements from group V). Semiconductor materials can also include impurities (e.g., doped, which include chosen impurities that have a deficiency or surplus of valence electrons).

In some embodiments, the third material is a quaternary semiconductor comprising InGaAsP, and the fourth material is a binary semiconductor comprising InP (e.g., and not Ga or As). In comparison to the embodiment in FIG. 4, the third material is made of InGaAsP instead of InP to make the buffer layers 108 more resistant to etching during removal of the substrate 112. Thus the buffer layers 108 will be more resistant to etchant during substrate removal, and the buffer layers 108 will have straighter sides 120 after removing the substrate 112 (e.g., less or no undercut 404 compared to buffer layers 108 comprising a binary semiconductor of InP).

In some embodiments, a higher percentage of As, as compared to P, leads to less etching of a material while using a selective etchant to etch InP. However, a higher percentage of As also leads to a less favorable index of refraction. In some embodiments, to balance selective etching and index of refraction for the third material (buffer layer 108), x is equal to or greater than 0.03, 0.05, or 0.1; and equal to or less than 0.5, 0.3, or 0.2; where x is a value from 0 to 1 in: As(x)J(1−x), and J is one or more elements in column V of the periodic table. For example, material three comprises a quaternary semiconductor of $InGaAs_{0.13}P_{0.87}$ (x=0.13). In some embodiments, the fifth material (etch stop 116) is designed so that x is equal to or greater than 0.3, 0.5, 0.6, or 0.7; and equal to or less than 0.7, 0.8, or 1.0; where x is a value from 0 to 1 in: As(x)J(1−x), and J is one or more elements in column V of the periodic table (and J is not present for x=1).

In some embodiments, the active region 104 comprises a multi-quantum well 604 that is part of a separate confinement heterostructure. The separate confinement heterostructure comprises the multi-quantum well 604, a first cladding 616-1, and a second cladding 616-2, wherein the multi-quantum well 604 is between the first cladding 616-1 and the second cladding 616-2. The cladding 616 is made of a sixth material. The sixth material has a lower index of refraction than the second material (of the barrier layer 612), which helps to more tightly confine an optical mode of laser in the first device 100.

Examples of semiconductor materials include: the first material (well 608), $Al_{0.08}Ga_{0.212}In_{0.708}As$; the second material (barrier layer 612), $Al_{0.223}Ga_{0.288}In_{0.489}AS$; the third material (buffer layer 108), $InGaAs_{0.23}P_{0.77}$; the fourth material (substrate 112), InP; the fifth material (etch stop 116), $InGaAs_{0.62}P_{0.38}$; and the sixth material (cladding 616), $Al_{0.423}Ga_{0.047}In_{0.53}As$.

Figure 7:
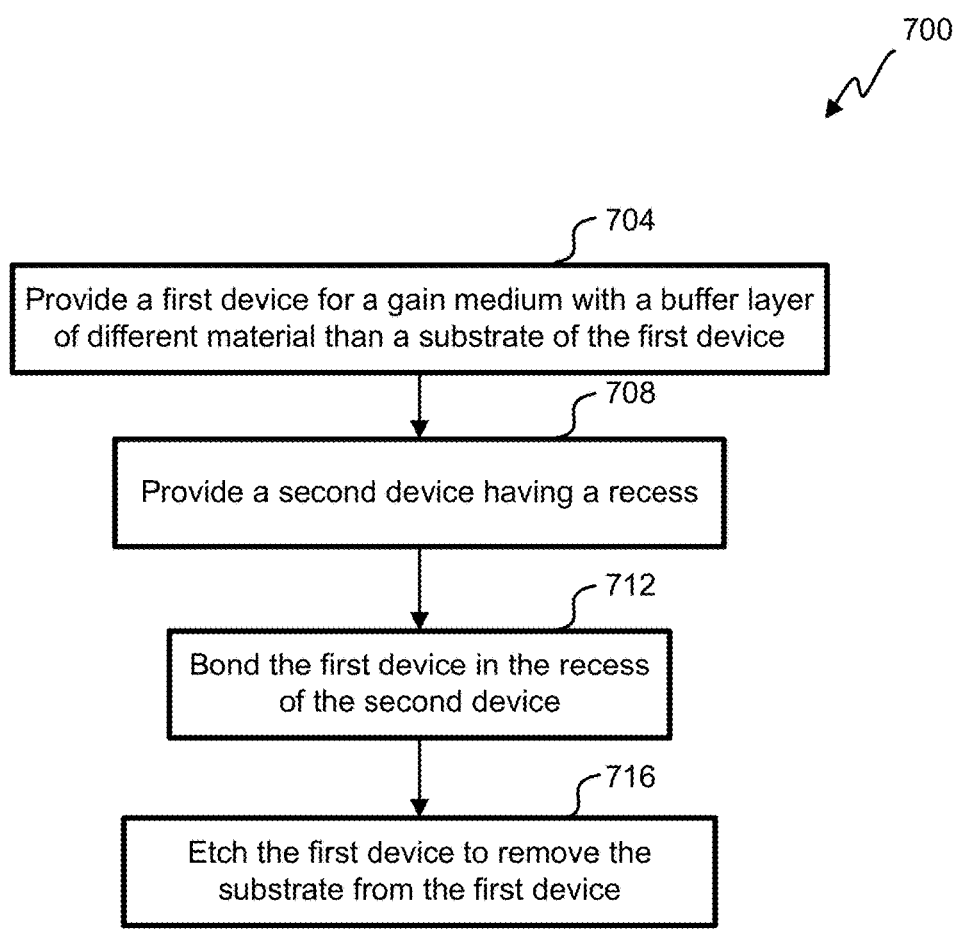
FIG. 7 illustrates a flowchart of an embodiment of a process for creating the composite device.

Referring next to FIG. 7, an embodiment of a process 700 for creating a composite semiconductor device is shown. The process 700 begins in step 704, where a first device 100 is provided as a gain medium for a semiconductor laser. The first device 100 comprises an active region 104 comprising alternating layers of a first material and a second material forming a multi-quantum well 604; a buffer layer 108 (e.g., first buffer layer 108-1) made of a third material; a substrate 112 made of a fourth material, wherein the fourth material is different from the third material; and an etch stop 116 made of a fifth material, wherein: the etch stop 116 is between the buffer layer 108 and the substrate 112, and the fifth material is different from the third material and the fourth material. The third material is different from the fourth material so that undercut 404 is reduced in the buffer layer 108.

In step 708, a second device 200 having a recess 216 is provided. The second device 200 comprises a device layer 204, a first wall 220-1 in the device layer 204 and a second wall 220-2 in the device layer 204, and a floor 224, such that the first wall 220-1, the second wall 220-2, and the floor 224 define the recess 216 in the second device 200.

In step 712, the first device 100 is bonded to the floor 224 in the recess 216 of the second device 200. The first device 100 is bonded in the recess 216 so that the active region 104 is optically aligned with the device layer 204. For example, pedestals are used for vertical alignment of the active region 104 with the device layer 204 (such as described in the '914 application). Bonding the first device 100 to the floor 224 in the recess 216 secures the first device 100 to the second device 200.

In step 716, the first device 100 is etched to remove all or part of the substrate 112. In some embodiments, the first device 100 is etched to the etch stop 116. The first device 100 is etched after step 712: bonding the first device 100 in the recess 216 of the second device 200. The first side 120-1 of the buffer layer 108 is not easily etched because the buffer layer 108 is made of different material than the substrate 112, and the etchant used does not etch the different material of the buffer layer 108 as quickly as the substrate 112.

In some embodiments, the substrate 112 is removed so electrical contacts can be formed on the first device 100 to apply voltage and/or current to the active region 104. In some embodiments, the substrate 112 is removed to reduce a height of the first device 100 in comparison with the second device 200 to enable hermetically sealing the first device 100 in the recess 216 of the second device 200 (e.g., a height of the first device 100 does not extend above a height of the second device 200, or the height of the first device 100 does not extend more than 10 μm above the second device 200 so that the first device 100 and/or the second device 200 can be covered (e.g., with SiO2).

When the specification and/or claims refer to different materials, different materials can mean different compositions of similar materials (e.g., $Al_{0.08}Ga_{0.212}In_{0.708}As$ is a different material than $Al_{0.223}Ga_{0.288}In_{0.489}As$). In some embodiments, different materials can also mean different elements (e.g., AlGaInAs comprises a different element than InGaAsP; and InGaAsP comprises a different element than AlGaInAs). Thus the buffer layers 108 can different from the substrate 112 by having different compositions of similar materials and/or having different elements.

The specific details of particular embodiments may be combined in any suitable manner without departing from the spirit and scope of embodiments of the invention. For example, compositions of materials can be changed for different wavelengths (e.g., a substrate 112 of GaAs could be used with InGaP buffer layers 108; or a GaSb substrate could be used). Additionally, other elements could be used for semiconductor materials. For example, group IV (e.g., Si and/or Ge), or II-VI compound semiconductors could be used instead of III-V compounds. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, in some embodiments, the active region 104 absorbs light instead of emits light. Thus the active region 104 is used as a photo detector. In some embodiments, the active region 104 is used as a modulator. The embodiments were chosen and described in order to explain the principles of the invention and its practical applications to thereby enable others skilled in the art to utilize the invention in various embodiments and with various modifications as are suited to the particular use contemplated.

It is noted that some embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged, unless indicated to the contrary. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary. All patents, patent applications, publications, and descriptions mentioned here are incorporated by reference in their entirety for all purposes. None is admitted to be prior art.

What is claimed is:

1. A device comprising:
   an active region comprising alternating layers of a first material and a second material forming a multi-quantum well, wherein:
      the first material is used as wells of the multi-quantum well; and
      the second material is used as barrier layers of the multi-quantum well;
   a first buffer layer, wherein the first buffer layer is made of a third material;

a second buffer layer, wherein the multi-quantum well is between the first buffer layer and the second buffer layer;
a substrate, wherein:
the substrate is made of a fourth material; and
the fourth material is different from the third material;
an etch stop, wherein:
the etch stop is made of a fifth material;
the first buffer layer is between the multi-quantum well and the etch stop;
the etch stop is between the first buffer layer and the substrate, to facilitate substrate removal; and
the fifth material is different from the third material and the fourth material; and
a first cladding and a second cladding, wherein:
the first cladding is made of a sixth material;
the multi-quantum well is between the first cladding and the second cladding; and
the first cladding and the second cladding are both between the first buffer layer and the second buffer layer.

2. The device as recited in claim 1, wherein the third material comprises a ternary semiconductor or a quaternary semiconductor.

3. The device as recited in claim 2, wherein the third material comprises Indium, Gallium, Arsenic, and Phosphorus (InGaAsP).

4. The device as recited in claim 3, wherein for the third material x is equal to or less than 0.5 and greater than zero for InGaAs(x)P(1−x).

5. The device as recited in claim 4, wherein the fifth material comprises InGaAs(x)P(1−x) and x is equal to or greater than 0.5 and equal to or less than 1.

6. The device as recited in claim 3, the third material is doped with impurities having a surplus or a deficit of valence electrons.

7. The device as recited in claim 2, wherein the fourth material is a group IV or a binary semiconductor.

8. The device as recited in claim 7, wherein the fourth material comprises a binary semiconductor of InP, GaAs, or GaSb.

9. The device as recited in claim 1, wherein:
the device is a first device;
the first device is bonded to a second device;
the second device comprises:
a device layer;
a first wall and a second wall in the device layer; and
a floor such that the first wall, the second wall, and the floor define a recess in the second device; and
the first device is bonded to the floor, in the recess, of the second device so that the active region is optically aligned with the device layer.

10. A method for creating a composite device for use as a semiconductor laser, the method comprising:
providing a first device as a gain medium for the semiconductor laser, the first device comprising:
an active region comprising alternating layers of a first material and a second material forming a multi-quantum well;
a buffer layer made of a third material;
a substrate made of a fourth material, wherein the fourth material is different from the third material; and
an etch stop made of a fifth material, wherein:
the etch stop is between the buffer layer and the substrate; and
the fifth material is different from the third material and the fourth material;
providing a second device, wherein the second device comprises:
a device layer;
a first wall and a second wall in the device layer; and
a floor such that the first wall, the second wall, and the floor define a recess in the second device;
bonding the first device to the floor of the recess of the second device so that the active region is optically aligned with the device layer; and
etching the first device, after bonding the first device to the second device, to remove at least a portion of the substrate of the first device.

11. The method of claim 10, wherein:
the fourth material comprises a binary semiconductor; and
the third material comprises a ternary semiconductor or quaternary semiconductor.

12. The method of claim 11, wherein the third material comprises InGaAs(x)P(1−x) and x is equal to or less than 0.5 and greater than zero for the third material.

13. The method of claim 12, wherein:
the fourth material comprises InP; and
the fifth material comprises InGaAs(x)P(1−x) and x is equal to or greater than 0.5 and equal to or less than 1.0 for the fifth material.

14. The method of claim 10, wherein etching the first device comprises:
applying photoresist to the composite device; and
etching the substrate, wherein a portion of the substrate removed by etching had a thickness between 150 μm and 1 mm before etching.

15. A composite semiconductor device, the composite semiconductor device comprising:
a first device for a gain medium for a semiconductor laser, the first device comprising:
an active region comprising alternating layers of a first material and a second material forming a multi-quantum well;
a buffer layer made of a third material, wherein the third material comprises a ternary semiconductor or a quaternary semiconductor; and
an etch stop made of a different material than the third material, wherein the buffer layer is between the active region and the etch stop;
a second device, wherein the second device comprises:
a device layer;
a first wall in the device layer;
a second wall in the device layer; and
a floor, such that the first wall, the second wall, and the floor define a recess in the second device; and
a bond securing the first device to the floor, in the recess, of the second device, wherein the active region is optically aligned with the device layer.

16. The composite semiconductor device of claim 15, wherein:
the first device further comprises a substrate of a fourth material;
the etch stop is between the buffer layer and the substrate; and
the fourth material comprises a binary semiconductor.

17. The composite semiconductor device of claim 15, wherein the device layer is crystalline silicon.

18. The composite semiconductor device of claim 15, wherein the third material comprises InGaAs(x)P(1−x) and x is equal to or less than 0.5 and greater than zero.

19. The composite semiconductor device of claim 15, wherein:
- the buffer layer is a first buffer layer; and
- the first device further comprises:
    - a second buffer layer, wherein the multi-quantum well is between the first buffer layer and the second buffer layer;
    - a first cladding; and
    - a second cladding, wherein:
        - the multi-quantum well is between the first cladding and the second cladding; and
        - the first cladding and the second cladding are both between the first buffer layer and the second buffer layer.

* * * * *